United States Patent
Arsovski

(10) Patent No.: US 9,530,500 B2
(45) Date of Patent: *Dec. 27, 2016

(54) CONVERTING AN XY TCAM TO A VALUE TCAM

(71) Applicant: GLOBALFOUNDRIES INC., Grand Cayman (KY)

(72) Inventor: Igor Arsovski, Williston, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 15/048,256

(22) Filed: Feb. 19, 2016

(65) Prior Publication Data

US 2016/0172038 A1   Jun. 16, 2016

Related U.S. Application Data

(63) Continuation of application No. 14/152,345, filed on Jan. 10, 2014, now Pat. No. 9,286,980.

(51) Int. Cl.
| | | |
|---|---|---|
| *G11C 15/00* | (2006.01) | |
| *G11C 15/04* | (2006.01) | |
| *G06F 11/10* | (2006.01) | |
| *H04L 12/743* | (2013.01) | |
| *G11C 11/417* | (2006.01) | |
| *G06F 17/30* | (2006.01) | |

(52) U.S. Cl.
CPC ......... *G11C 15/046* (2013.01); *G06F 11/1064* (2013.01); *G11C 11/417* (2013.01); *G11C 15/04* (2013.01); *H04L 45/7457* (2013.01); *G06F 17/30982* (2013.01)

(58) Field of Classification Search
CPC .... G11C 15/04; G11C 15/046; H04L 45/7457; G06F 11/1064; G06F 17/30982
USPC ........... 365/49.1, 49.11, 49.12, 49.16, 49.17, 365/49.18
See application file for complete search history.

(56) References Cited

U.S. PATENT DOCUMENTS

| | | | |
|---|---|---|---|
| 5,813,001 A * | 9/1998 | Bennett | ............ G06F 17/30979 |
| 6,707,692 B2 | 3/2004 | Hata | |
| 7,433,217 B1 | 10/2008 | Maheshwarl | |
| 7,570,503 B1 | 8/2009 | Maheshwari | |
| 7,848,129 B1 | 12/2010 | Deshpande et al. | |
| 8,031,502 B2 | 10/2011 | Kim | |
| 8,130,525 B2 | 3/2012 | Arsovski | |
| 8,233,302 B2 | 7/2012 | Arsovski | |

(Continued)

OTHER PUBLICATIONS

Nourani et al., "A Reconfigurable CAM Architecture for Network Search Engines", IEEE Center for Integrated circuits & Systems, 2006; 6 Pages.

*Primary Examiner* — Fernando Hidalgo
(74) *Attorney, Agent, or Firm* — David Cain; Andrew M. Calderon; Roberts Mlotkowski Safran Cole & Calderon, P.C.

(57) ABSTRACT

Approaches for an integrated circuit ternary content addressable memory (TCAM) are provided. A system includes an array of XY TCAM cells and respective translation circuits connected to respective pairs of the XY TCAM cells. The system also includes a memory controller structured to provide control signals to the respective translation circuits. The memory controller and respective translation circuits are structured to control the array of XY TCAM cells to perform single cycle update and single cycle search operations.

10 Claims, 6 Drawing Sheets

(56) References Cited

U.S. PATENT DOCUMENTS

| | | | |
|---|---|---|---|
| 8,995,160 B2* | 3/2015 | Menut | G11C 15/046 365/49.1 |
| 2011/0255322 A1* | 10/2011 | Park | G11C 15/00 365/49.17 |
| 2013/0135914 A1 | 5/2013 | Kohli | |

* cited by examiner

CONVERTING AN XY TCAM TO A VALUE TCAM

FIELD OF THE INVENTION

The invention relates to integrated circuit memory devices and, more particularly, to a ternary content addressable memory (TCAM).

BACKGROUND

A content addressable memory (CAM) is a storage device in which storage locations can be identified by both their location and address through a read operation, as well as by data contents through a search operation. An access by content starts by presenting a search argument to the CAM, wherein a location that matches the argument asserts a corresponding match line. One use for such a memory is in dynamically translating logical addresses to physical addresses in a virtual memory system. In this case, the logical address is the search argument and the physical address is produced as a result of the dynamic match line selecting the physical address from a storage location in a random access memory (RAM). Accordingly, exemplary CAM search operations are used in applications such as address-lookup in network ICs, translation lookaside buffers (TLB) in processor caches, pattern recognition, data compression, etc. CAMs are also frequently used for address-look-up and translation in Internet routers and switches.

A CAM typically includes an array of CAM cells arranged in rows and columns, where each row of the CAM array corresponds to a stored word. The CAM cells in a given row couple to a word line and a match line associated with the row. The word line connects to a control circuit that can either select the row for a read/write operation or bias the word line for a search. The match line carries a signal that, during a search, indicates whether the word stored in the row matches an applied input search word. Each column of the conventional CAM array corresponds to the same bit position in all of the CAM words, while the CAM cells in a particular column are coupled to a pair of bit lines and a pair of search-lines associated with the column. A search data is applied to each pair of search lines, which have a pair of complementary binary signals or unique ternary signals thereon that represent a bit of an input value. Each CAM cell changes the voltage on the associated match line if the CAM cell stores a bit that does not match the bit represented on the attached search lines. If the voltage on a match line remains unchanged during a search, the word stored in that row of CAM cells matches the input word.

Conventional CAM cells can include binary CAM cells as well as ternary CAM (TCAM) cells. A conventional TCAM cell can store three states, including a logic "0", logic "1" and a "don't care". When such a TCAM cell stores a logic "0" or logic "1", the TCAM cell can provide the same essential match operation as a binary CAM cell. However, when such a TCAM cell stores a "don't care" value, the TCAM cell can provide a match result regardless of the compare data value applied to the TCAM cell.

A TCAM can be XY TCAM or a single-cycle update TCAM (also called a value TCAM). In an XY TCAM, each TCAM cell includes an X cell (e.g., 6T SRAM X cell) and a Y cell (e.g., a 6T SRAM Y cell) that share a pair of bit lines. The bit lines are the wires that carry data that is written to or read from either the X cell or the Y cell. Since the X cell and the Y cell share common bit lines, the XY TCAM uses two cycles to update a stored entry in the TCAM cell, i.e., a first cycle to write to the X cell and a second cycle to write to the Y cell. In a value TCAM, the X cell and the Y cell are each connected to their own respective bit lines. In this regard, the value TCAM can perform single cycle updates by writing to both the X cell and the Y cell in a single cycle; however, the additional bit lines add a large amount of space to the circuit. Hence, an XY TCAM provides space savings but uses a two-cycle update operation, whereas a value TCAM provides a single cycle update operation but uses more chip space.

SUMMARY

In a first aspect of the invention, there is an integrated circuit ternary content addressable memory (TCAM) system. The system includes an array of XY TCAM cells and respective translation circuits connected to respective pairs of the XY TCAM cells. The system also includes a memory controller structured to provide control signals to the respective translation circuits. The memory controller and respective translation circuits are structured to control the array of XY TCAM cells to perform single cycle update and single cycle search operations.

In another aspect of the invention, there is an integrated circuit ternary content addressable memory (TCAM) system. The system includes a first XY TCAM cell and a second XY TCAM cell that share a common bit line. The system also includes a translation circuit connected to the first XY TCAM cell and the second XY TCAM cell. The system further includes a memory controller structured to provide an external data in signal and an external bit enable signal to the translation circuit. The translation circuit is structured to provide a first data in signal to the first XY TCAM cell and a second data in signal to the second XY TCAM cell based on the external data in signal and the external bit enable signal. The translation circuit is structured to provide a first bit enable signal to the first XY TCAM cell and a second bit enable signal to the second XY TCAM cell.

In another aspect of the invention, a method for a ternary content addressable memory (TCAM). The method includes controlling an array of XY TCAM cells to perform single cycle update and single cycle search operations using a memory controller and respective translation circuits connected to respective pairs of the XY TCAM cells.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a ternary content addressable memory (TCAM) system which comprises the structures of the present invention. In still further embodiments, a method in a computer-aided design system is provided for generating a functional design model of a ternary content addressable memory (TCAM) system The method comprises generating a functional representation of the structural elements of the ternary content addressable memory (TCAM) system.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuit memory devices and, more particularly, to a ternary content addressable memory (TCAM). According to aspects of the invention, an array of XY TCAM cells is controlled to perform single cycle update and single cycle search operations. In embodiments, the control is provided by respective translation circuits connected to respective pairs of the XY TCAM cells in the array. In aspects, a memory controller provides external "data in" signals and "bit enable" signals to the respective translation circuits, and the respective translation circuits modify these signals to provide internal "data in" and "bit enable" signals to each cell in an associated pair of XY TCAM cells. In this manner, implementations of the invention create a virtual search decode-2 TCAM by modifying the inputs and outputs of the TCAM through logic manipulation external to the TCAM.

Figure 1:
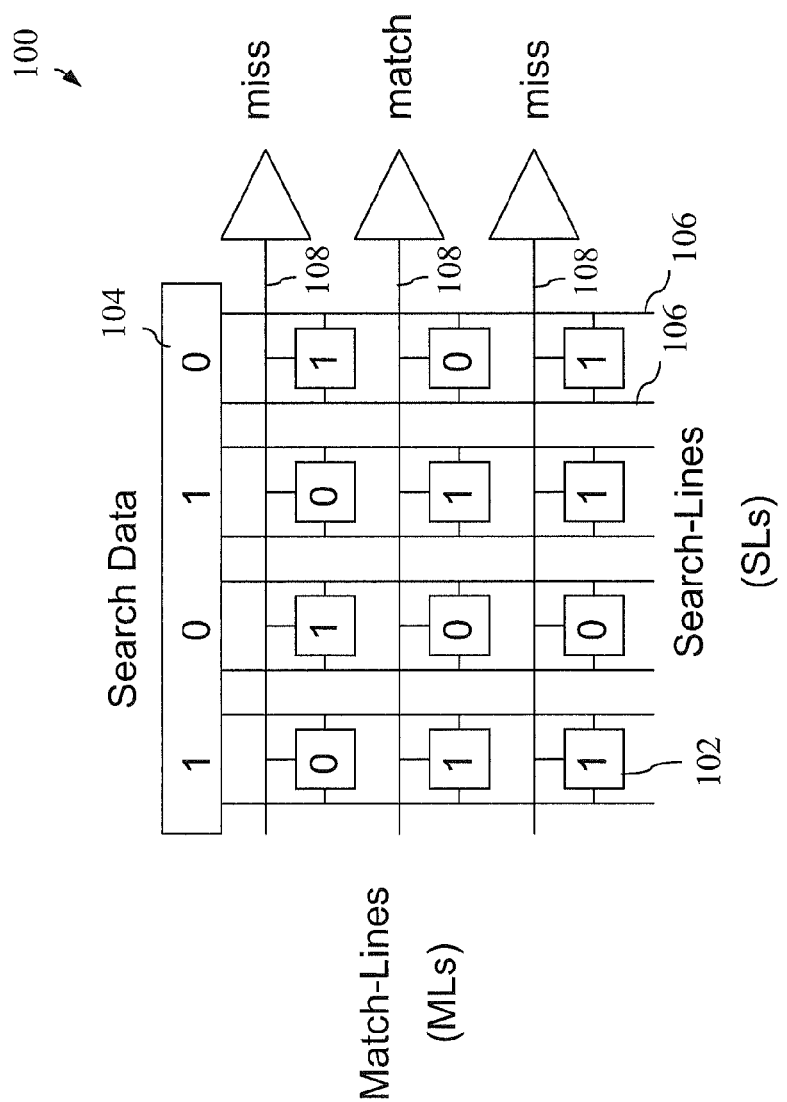
FIG. 1 is a schematic diagram illustrating the operation of a CAM array.

Referring initially to FIG. 1, there is shown a schematic diagram illustrating the operation of a CAM array 100. In the example depicted, the CAM array includes a plurality of individual cells 102, arranged into rows (in a word line direction) and columns (in a bit line direction). Although a simple 3×4 array is depicted for illustrative purposes, it will be appreciated that an actual CAM array may have hundreds or thousands of bits in the row and column directions. As opposed to RAM devices where a specific address (word line) is presented and data is read from/written to that address, the CAM 100 operates by broadcasting search data 104 to the array through a multiple pairs of search lines 106 associated with each column, and determining which row(s) has data matching the broadcasted search data. In order to detect and indicate the results of the search, each row of the array includes a corresponding match line 108. The match lines 108 are precharged to a logical high value such that if any one or more data bits within that row that does not match the corresponding bit in the search data 104, then the match line is discharged to a logical low value, signifying a mismatch condition. Conversely, if each data bit within that row matches the corresponding bit in the search data 104, then the match line is not discharged, signifying a match condition.

In the example shown in FIG. 1, it will be seen that the search data '1010' exactly matches the data in the second row of the array, thus that match line remains charged high so as to reflect a match condition. On the other hand, the first and third rows of the array both have at least one bit that does not match the '1010' search data, thus those match lines are discharged to reflect a mismatch condition. The CAM array 100 is capable of comparing a search word with every other stored word in the array along the word line (row) direction.

Figure 2:
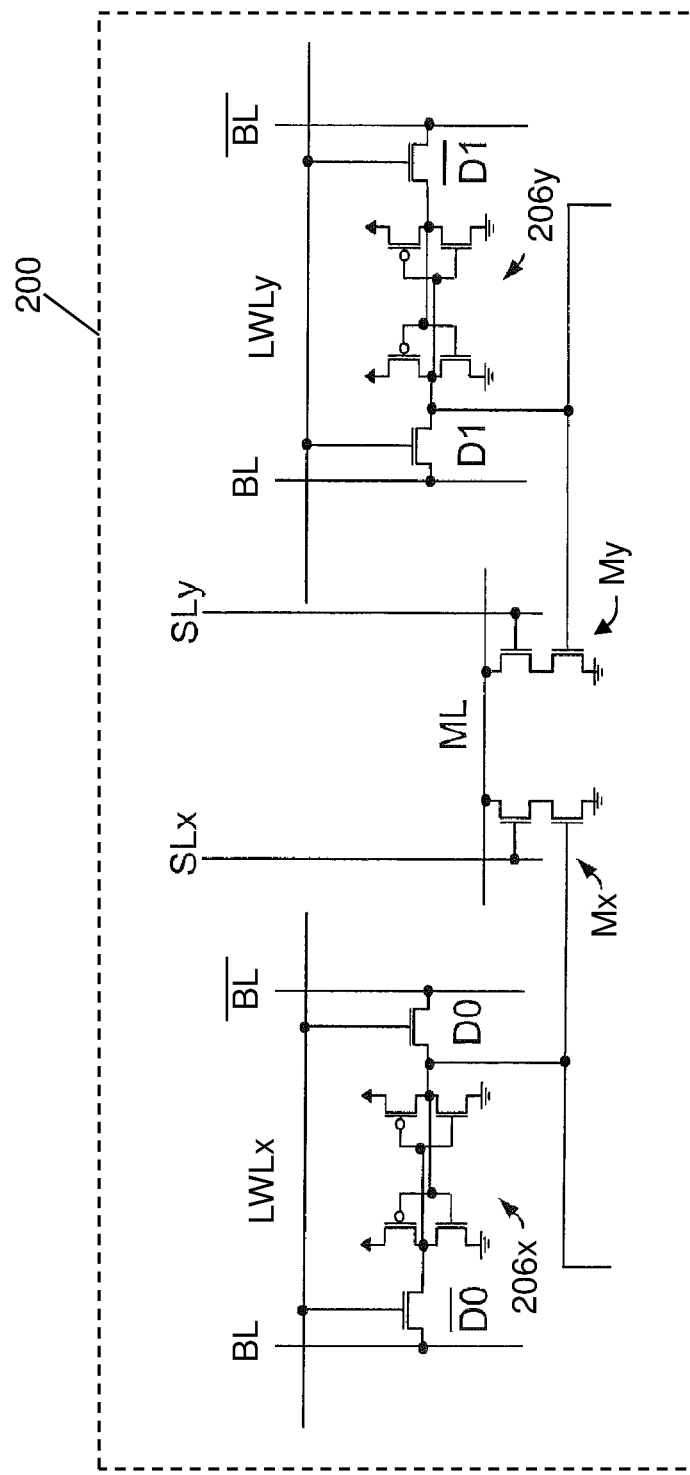
FIG. 2 is a schematic diagram of a 20-transistor (20T), NOR-type ternary CAM (TCAM) cell.

FIG. 2 is a schematic diagram of a 20-transistor (20T) ternary CAM (TCAM) cell 200. The TCAM cell 200 includes devices that facilitate writing to the cell, reading the cell (in a non-search mode), and performing a ternary search in the row or word line direction of an array employing the cell 200.

More specifically, the TCAM cell 200 includes a pair of 6T SRAM (static random access memory) storage devices, 206$x$, 206$y$. In a binary CAM cell, only one SRAM device would be needed to store either a logical 0 or 1 therein. However, since a TCAM also provides for a "don't care" or "X" state, a second storage bit is used in the cell. Each 6T SRAM storage device 206$x$, 206$y$, in turn includes a 4T latch device comprising a pair of cross-coupled CMOS inverters, and a pair of access transistors. The access transistors are activated by charging the associated local word line for the SRAM latches (i.e., LWLx, LWLy), which couples the true and complement data nodes (D0, D0 bar, D1, D1 bar) of the latches to the write bit lines (i.e., BL, BL bar). In the illustrated embodiment, data is written to the cells using the bit lines.

In order to accomplish row-oriented data searching in the TCAM cell 200, the TCAM cell 200 also includes match line circuitry, depicted as search lines SLx and SLy, row-oriented match line ML, and NFET stacks Mx and My. The search lines SLx and SLy are disposed in the column direction of the array, while the match line ML is disposed along the row direction of the array. The gate terminals of the bottom NFETs in each NFET stack Mx, My are respectively coupled to the true data nodes D0, D1 of the SRAM storage devices 206$x$, 206$y$. Search line SLx is connected to a gate of one of the FETs of NFET stack Mx, while search line SLy is connected to a gate of one of the FETs of NFET stack My.

Still referring to FIG. 2, the SRAM storage devices 206$x$, 206$y$ of the TCAM cell 200 share a pair of bit lines (i.e., BL, BL bar). In this regard, the TCAM cell 200 is an XY TCAM cell in which storage device 206$x$ is referred to as the X cell and storage device 206$y$ is referred to as the Y cell.

Figure 3:
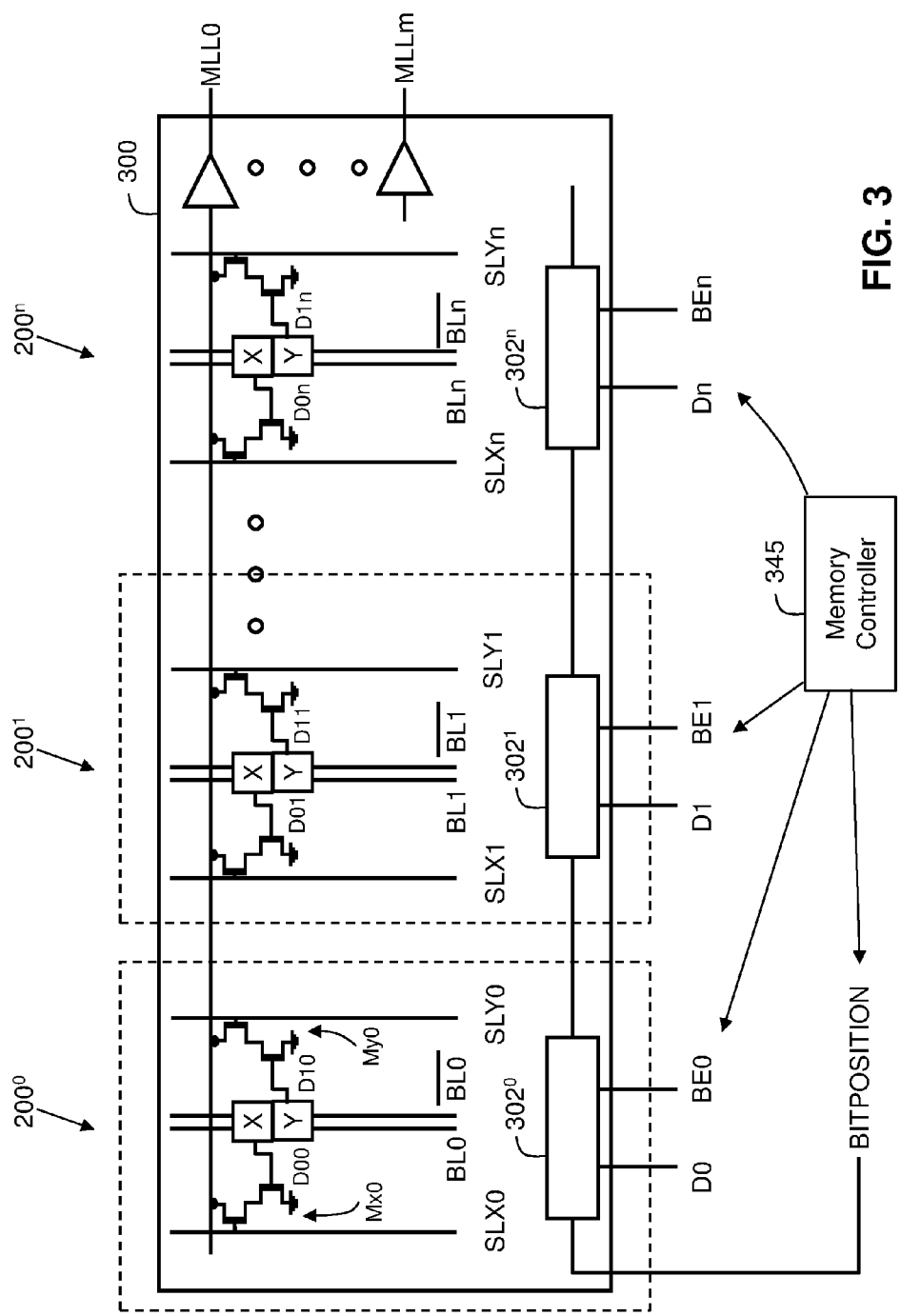
FIG. 3 is a schematic diagram of a TCAM array.

FIG. 3 shows an array 300 of TCAM cells $200^0$, $200^1$, ..., $200^n$, each of which may be implemented as cell 200 shown in FIG. 2. The cells $200^0$, $200^1$, ..., $200^n$ make up a row of cells connected to a match line MML0 in a manner similar to a row of cells 102 connected to a match line 108 in FIG. 1. The array 300 may include similar rows of cells connected to match lines up to MLLm, where number "n" of cells per row and number "m" of rows are any desired integers that define the size of the array 300.

In representative cell $200^0$, the box labeled "X" corresponds to the X cell 206$x$ of FIG. 2, and the box labeled "Y" corresponds to the Y cell 206$y$ of FIG. 2. Similarly, data node D00 in cell $200^0$ corresponds to data node D0 associated with the X cell 206$x$ of FIG. 2, and data node D10 corresponds to data node D1 associated with the Y cell 206$y$ of FIG. 2. Similarly, bit line BL0 in cell $200^0$ corresponds to bit line BL of FIG. 2, bit line BL0 bar corresponds to BL bar, search line SLX0 corresponds to SLx, search line SLY0 corresponds to SLy, NFET stack Mx0 corresponds to Mx, NFET stack My0 corresponds to My, and match line MLL0 corresponds to ML.

With continued reference to FIG. 3, each cell $200^0$, $200^1$, ..., $200^n$ includes or is associated with a circuit $302^0$, $302^1$, ..., $302^n$ that is connected to elements of the cell to provide control and data signals to the cell. For example, circuit $302^0$ provides a "bit position" signal (BITPOSITION) to the local word line (e.g., LWLx and LWLy) of each of the X cell and the Y cell of the cell $200^0$ for controlling which of the X cell and Y cell is written to in a particular cycle. Circuit $302^0$ also provides a "data in" signal (D0) to the bit lines (BL0, BL0 bar) for writing data to the X cell and Y cell, and for compare operations. Circuit $302^0$ also provides a "bit enable" signal (BE0) to the search lines (SLX0, SLY0) for enabling searching of the data stored in the X cell and Y cell. A memory controller 345 may be used to provide the bit position, data in, and bit enable signals to each of the cells $200^0$, $200^1$, ..., $200^n$ via the circuits $302^0$, $302^1$, ..., $302^n$. The XY TCAM cells $200^0$, $200^1$, ..., $200^n$, each typically require two cycles to update their stored value, i.e., a first write cycle to update the stored value in the X cell and a second write cycle to update the stored value in the Y cell.

Tables 1 and 2 show how the bit position, data in, and bit enable signals are used to write to and search the TCAM cells. An asterisk "*" indicates a "don't care" value. A BITPOSITION value of "1" enables writing to the X cell, a BITPOSITION value of "0" enables writing to the Y cell, a BE value of "0" enables searching the X cell, and a BE value of "1" enables searching the Y cell. The invention is not limited to the exemplary implementation shown in Tables 1 and 2, and other encoding schemes may be used within the scope of the invention.

TABLE 1

| Write Operation Inputs | | Cell Contents | |
| --- | --- | --- | --- |
| BITPOSITION | D (data in) | X cell | Y cell |
| 1 | 0 | 0 | Unchanged |
| 1 | 1 | 1 | Unchanged |
| 0 | 0 | Unchanged | 0 |
| 0 | 1 | Unchanged | 1 |

TABLE 2

| Search Operation Inputs | | Cell Contents | | Result of Search |
| --- | --- | --- | --- | --- |
| BE (bit enable) | D (data in) | X cell | Y cell | of the Cell |
| 0 | * | * | * | Match |
| 1 | 0 | 0 | 1 | No Match |
| 1 | 0 | 1 | 0 | Match |
| 1 | 1 | 0 | 1 | Match |
| 1 | 1 | 1 | 0 | No Match |
| 1 | * | 1 | 1 | No Match |

Figure 4:
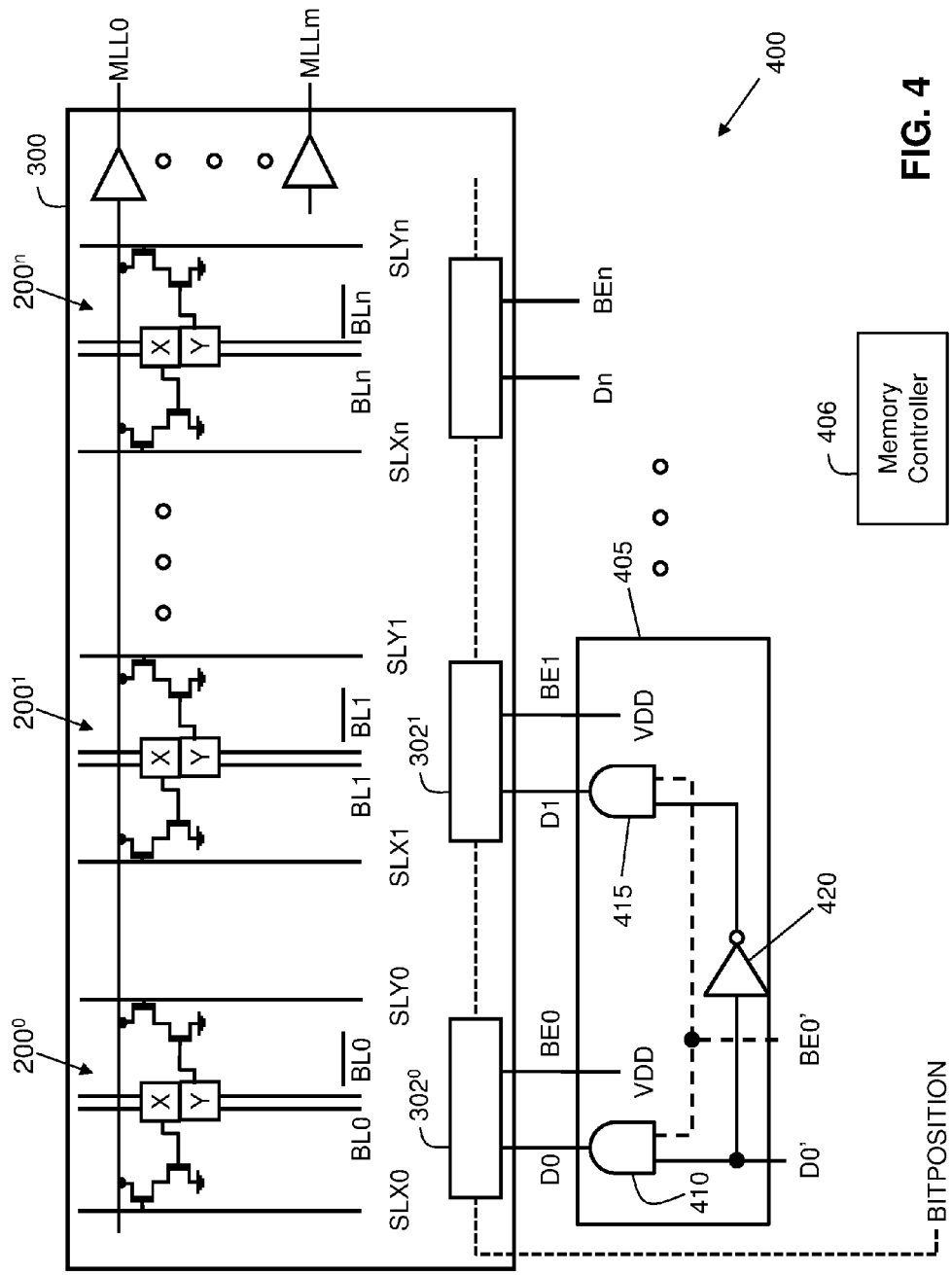
FIG. 4 is a schematic diagram of a TCAM system in accordance with aspects of the invention.

FIG. 4 shows a TCAM system 400 in accordance with aspects of the invention. The system 400 includes a TCAM array 300 (e.g., similar to array 300 of FIG. 3) and at least one translation circuit 405 connected to the inputs of a pair of cells (e.g., cells $200^0$ and $200^1$) in the manner shown in FIG. 4. The translation circuit 405 and memory controller 406 are configured to modify the inputs and outputs of the pair of XY TCAM cells to cause the pair of cells to function as a cell of a value TCAM. In embodiments, the translation circuit 405 and memory controller 406 are configured to set the data in (D) and bit enable (BE) signals of the pair of XY TCAM cells such that each one of the pair of XY TCAM cells utilizes (i.e., writes data to and performs searches against) only one of its two SRAM cells, e.g., either the X cell or the Y cell in each cell of the pair of XY TCAM cells. Since each XY TCAM cell has its own bit line, data can be written to the respective utilized cells of the pair of XY TCAM cells in a single cycle, e.g., similar to a value TCAM. In this manner, implementations of the invention provide a translation circuit and encoding scheme that adapts an XY TCAM to be used as a single cycle update and single cycle search TCAM, e.g., similar to a value TCAM.

In embodiments, the translation circuit 405 includes AND gate 410, AND gate 415, and inverter 420. According to aspects of the invention, an external data in signal D0' is provided to one of the inputs of AND gate 410, and the inverse of D0' is provided to one of the inputs of AND gate 415 via inverter 420. An external bit enable signal BE0' is provided to one of the inputs of each of AND gate 410 and AND gate 420. D0' and BE0' may be provided to translation circuit 405 by the memory controller 406 according to predefined logic. The output of AND gate 410 is provided as the D0 signal, and the output of AND gate 420 is provided as the D1 signal. Translation circuit 405 is configured to supply a high logic state (e.g., VDD) to each of BE0 and BE1.

Although the details of only one translation circuit 405 are shown in FIG. 4, embodiments of the invention include respective similar translation circuits similarly connected to other respective pairs of TCAM cells in the array 300. For example, respective translation circuits each similar to translation circuit 405 may be connected to other pairs of cells, e.g., cells $200^2$ and $200^3$, ..., cells $200^{n-1}$ and $200^n$, etc.

According to aspects of the invention, the memory controller 406 is configured to store zeros in each of the X cells of all cells $200^0$ ... $200^n$, and then to use the Dx' and BEx' signals to write data to, and search data in, the Y cells of cells $200^0$ ... $200^n$, where "x" equals integers from 0 to (n+1)/2. For example, x=0 for the cell pair $200^0$ and $200^1$, x=1 for the next cell pair $200^2$ and $200^3$, and x=(n+1)/2 for the last cell pair $200^{n-1}$ and $200^n$, where each respective cell pair has its own translation circuit 405 with inputs Dx' and BEx' provided by the memory controller 406.

In embodiments, the memory controller 406 stores zeros in the X cells of cells $200^0$ ... $200^n$ by writing (BITPOSITION,Dx')=(1,0) for all addresses in the array 300. The memory controller 406 sets BITPOSITION=0 and writes data to the Y cells of cells $200^0$ ... $200^n$ using Dx' and BEx' according to Table 3. An asterisk "*" indicates a "don't care" value.

TABLE 3

| Dx' | BEx' | Write to Y cell |
| --- | --- | --- |
| 0 | 0 | * |
| 1 | 0 | * |
| 0 | 1 | 0 |
| 1 | 1 | 1 |

In embodiments, the memory controller 406 sets BITPOSITION=0 and searches data stored in the Y cells of cells $200^0$ ... $200^n$ using Dx' and BEx' according to Table 4. An asterisk "*" indicates a "don't care" value.

TABLE 4

| Dx' | BEx' | Search against Y cell |
| --- | --- | --- |
| 0 | 0 | * |
| 1 | 0 | * |
| 0 | 1 | 0 |
| 1 | 1 | 1 |

Figure 5:
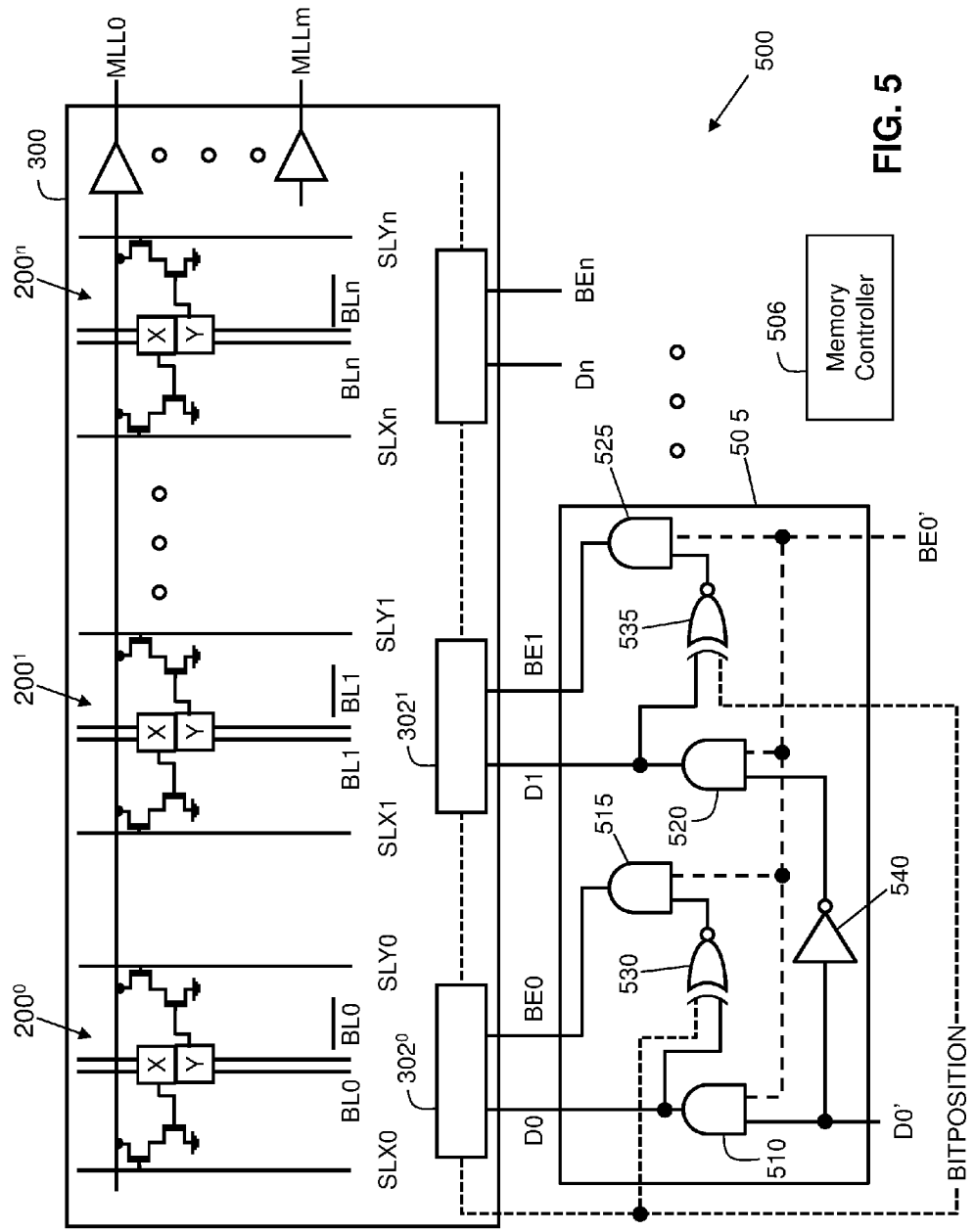
FIG. 5 is a schematic diagram of a TCAM system in accordance with aspects of the invention.

FIG. 5 shows a TCAM system 500 in accordance with aspects of the invention. The system 500 includes a TCAM array 300 (e.g., similar to array 300 of FIG. 3) and at least one translation circuit 505 connected to the inputs of a pair of cells (e.g., cells $200^0$ and $200^1$) in the manner shown in FIG. 5. The translation circuit 505 and memory controller 506 are configured to modify the inputs and outputs of pairs of the XY TCAM cells such that the two X cells of a pair of XY TCAM cells are written together and searched together, and the two Y cells of the pair of XY TCAM cells are written together and searched together. Since the respective X cells of the pair of XY TCAM cells are associated with different respective bit lines relative to one another, and the respective Y cells of the pair of XY TCAM cells are associated with different respective bit lines relative to one another, the translation circuit and memory controller are capable of utilizing the XY TCAM cells in single cycle update and single cycle search operations that utilize the full storage capacity of the TCAM array.

In embodiments, the translation circuit includes AND gates 510, 515, 520, 525, XNOR gates 530, 535, and inverter 540 connected in the manner shown in FIG. 5. According to aspects of the invention, BE0' is provided to one of the inputs of each of AND gates 510, 515, 520, 525. D0' is provided to one of the inputs of AND gate 510, while the inverse of D0' (inverted by inverter 540) is provided to one of the inputs of AND gate 520. The output of AND gate 510 is provided as the D0 signal, and the output of AND gate 520 is provided as the D1 signal. The output of AND gate 510 is provided to one of the inputs of XNOR gate 530, with the other input of XNOR gate 530 being provided by BITPOSITION. The output of XNOR gate 530 is provided to one of the inputs of AND gate 515. The output of AND gate 515 is provided as the BE0 signal. The output of AND gate 520 is provided to one of the inputs of XNOR gate 535, with the other input of XNOR gate 535 being provided by BITPOSITION. The output of XNOR gate 535 is provided to one of the inputs of AND gate 525. The output of AND gate 525 is provided as the BE1 signal.

Although the details of only one translation circuit 505 are shown in FIG. 5, embodiments of the invention include similar respective translation circuits similarly connected to other respective pairs of TCAM cells in the array 300. For example, translation circuits each similar to translation circuit 505 may be provided for other pairs of cells, e.g., cells $200^2$ and $200^3$, ..., cells $200^{n-1}$ and $200^n$, etc. Further, each respective cell translation circuit has inputs Dx' and BEx' provided by the memory controller 406, where "x" equals integers from 0 to (n+1)/2 in the same manner as described with respect to FIG. 4. Thus, there are "x" number of cells pairs and "x" number or translation circuits.

In embodiments, the BITPOSITION, Dx', and BEx' signals are controlled and provided to each of the translation circuits by the memory controller 506. In aspects, the BITPOSITION, D', and BE' signals are provided according to Table 5 to perform a write operation. The header of Table 5 lists BITPOSITION (BP), D', BE' as shown in translation circuit 505, and D0, BE0, D1, BE1 as shown in cells $200^0$ and $200^1$; however, the values are applicable to Dx', BEx' for all translation circuits for all cell pairs. Values X0, Y0, X1, Y1 represent what is written to the respective X cells and Y cells of the pair of XY TCAM cells $200^0$ and $200^1$.

TABLE 5

| WRITE | BP | BE' | D' | D0 | BE0 | D1 | BE1 | X0 | Y0 | X1 | Y1 |
|---|---|---|---|---|---|---|---|---|---|---|---|
| * in X | 0 | 0 | 0 | 0 | 0 | 0 | 0 | 0 | — | 0 | — |
| * in X | 0 | 0 | 1 | 0 | 0 | 0 | 0 | 0 | — | 0 | — |
| 0 in X | 0 | 1 | 0 | 0 | 1 | 1 | 0 | 0 | — | 1 | — |
| 1 in X | 0 | 1 | 1 | 1 | 0 | 0 | 1 | 1 | — | 0 | — |
| * in Y | 1 | 0 | 0 | 0 | 0 | 0 | 0 | — | 0 | — | 0 |
| * in Y | 1 | 0 | 1 | 0 | 0 | 0 | 0 | — | 0 | — | 0 |
| 0 in Y | 1 | 1 | 0 | 0 | 0 | 1 | 1 | — | 0 | — | 1 |
| 1 in Y | 1 | 1 | 1 | 1 | 1 | 0 | 0 | — | 1 | — | 0 |

In aspects, the BITPOSITION, Dx', and BEx' signals are provided according to Table 6 to perform a search operation. The header of Table 6 lists BITPOSITION (BP), D', BE' as shown in translation circuit 505, and D0, BE0, D1, BE1 as shown in cells $200^0$ and $200^1$; however, the values are applicable to Dx', BEx' for all translation circuits for all cell pairs. Values SLX0, SLY0, SLX1, SLY1 represent that values applied on the respective search lines of the pair of XY TCAM cells $200^0$ and $200^1$.

TABLE 6

| SEARCH' | BP | BE' | D' | D0 | BE0 | D1 | BE1 | SLX0 | SLY0 | SLX1 | SLY1 |
|---|---|---|---|---|---|---|---|---|---|---|---|
| * in Y | 0 | 0 | 0 | 0 | 0 | 0 | 0 | 0 | 0 | 0 | 0 |
| * in Y | 0 | 0 | 1 | 0 | 0 | 0 | 0 | 0 | 0 | 0 | 0 |
| 1 in Y | 0 | 1 | 0 | 0 | 1 | 1 | 0 | 0 | 1 | 0 | 0 |
| 0 in Y | 0 | 1 | 1 | 1 | 0 | 0 | 1 | 0 | 0 | 0 | 1 |
| * in X | 1 | 0 | 0 | 0 | 0 | 0 | 0 | 0 | 0 | 0 | 0 |
| * in X | 1 | 0 | 1 | 0 | 0 | 0 | 0 | 0 | 0 | 0 | 0 |
| 1 in X | 1 | 1 | 0 | 0 | 0 | 1 | 1 | 0 | 0 | 1 | 0 |
| 0 in X | 1 | 1 | 1 | 1 | 1 | 0 | 0 | 1 | 0 | 0 | 0 |

As shown in Table 6, and in accordance with aspects of the invention, the search lines of the X cells are set to zero when a search operation is performed on the Y cells, and the search lines of the Y cells are set to zero when a search operation is performed on the X cells. In this manner, the XY TCAM array is partitioned into two portions: an X portion that uses X cells of pairs of XY TCAM cells, and a Y portion that uses Y cells of pairs of XY TCAM cells. The memory controller and translation circuit are configured to write to the X portion with a first set of data, and write to the Y portion with a second set of data. The memory controller and translation circuit are configured to use the BITPOSITION, Dx', and BEx' signals to store (e.g., write) and search data in the X portion and the Y portion in the manner shown in Tables 5 and 6. Read outputs may be addressed using a similar mapping function to that shown in Tables 5 and 6. By portioning the array of XY TCAM cells into an X portion and a Y portion and writing/searching as described herein, implementations of the invention may be used to control the array of XY TCAM cells to perform single cycle update and single cycle search operations.

Figure 6:
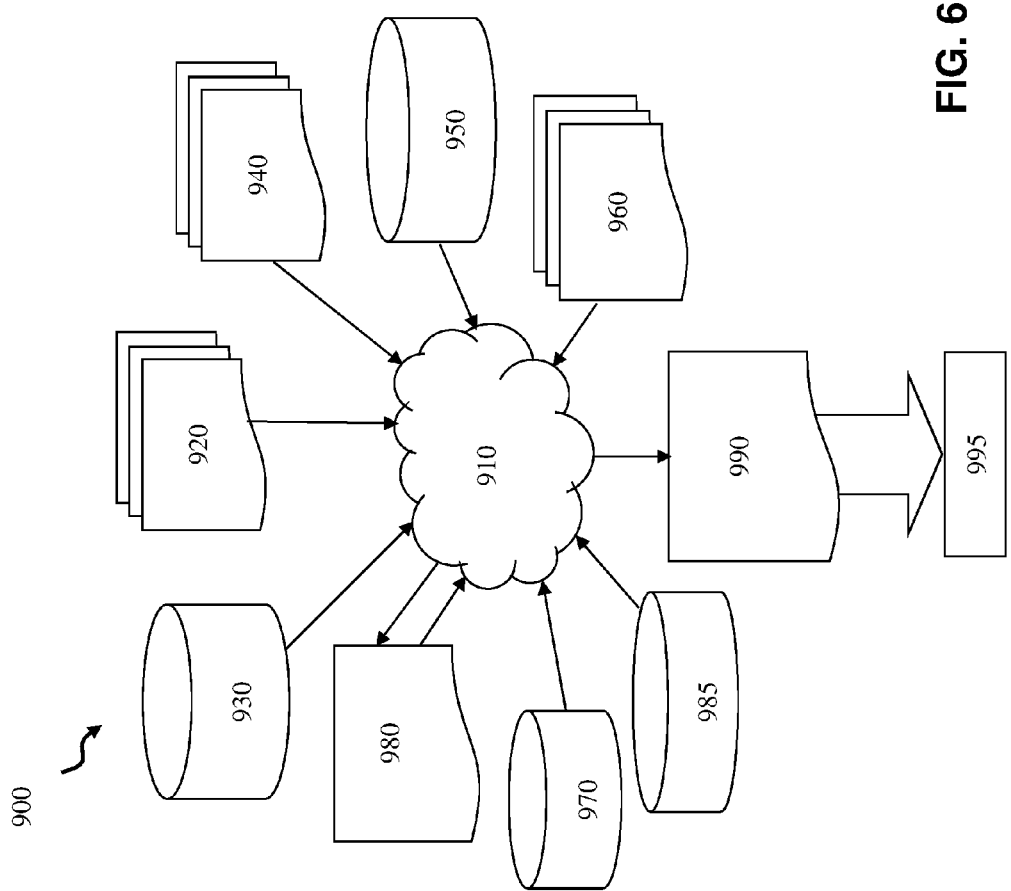
FIG. 6 is a flow diagram of a design process used in semiconductor design, manufacture, and/or test.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 4 and 5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 4 and 5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 4 and 5 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4 and 5. In one embodiment, design structure 990 may comprise a compiled, executable HDL simulation model that functionally simulates the devices shown in FIGS. 4 and 5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4 and 5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit ternary content addressable memory (TCAM) system, comprising:
   an array of XY TCAM cells, wherein each one of the XY TCAM cells comprises a first cell and a second cell that are connected to and share a common bit line;
   respective translation circuits connected to respective pairs of the XY TCAM cells; and
   a memory controller structured to provide control signals to the respective translation circuits, wherein the memory controller and respective translation circuits are structured to control the array of XY TCAM cells to perform single cycle update and single cycle search operations.

2. The system of claim 1, wherein:
   the first cell is connected to a first search line and comprises a first (static random access memory (SRAM) storage a first local word line; and
   the second cell is connected to a second search line and comprises a second SRAM storage a second local word line.

3. The system of claim 2, wherein the memory controller and the respective translation circuits are configured to:
   place a value of zero on the first search line when performing a search operation on the second cell; and
   place a value of zero on the second search line when performing a search operation on the first cell.

4. The system of claim 1, wherein, for each one of the XY TCAM cells, the first cell comprises an X cell connected to the common bit line and the second cell comprises a Y cell connected to the common bit line.

5. The system of claim 4, wherein two cycles are used to update a stored entry in each one of the XY TCAM cells.

6. The system of claim 5, wherein the two cycles comprise:
   a first cycle to write to the X cell; and
   a second cycle, different from the first cycle, to write to the Y cell.

7. A method for a ternary content addressable memory (TCAM), comprising controlling an array of XY TCAM cells to perform single cycle update and single cycle search operations using a memory controller and respective translation circuits connected to respective pairs of the XY TCAM cells, wherein each one of the XY TCAM cells comprises a first cell and a second cell that are connected to and share a common bit line.

8. The method of claim 7, wherein, for each one of the XY TCAM cells, the first cell comprises an X cell connected to the common bit line and the second cell comprises a Y cell connected to the common bit line.

9. The method of claim 8, wherein two cycles are used to update a stored entry in each one of the XY TCAM cells.

10. The method of claim 9, wherein the two cycles comprise:
    a first cycle to write to the X cell; and
    a second cycle, different from the first cycle, to write to the Y cell.

* * * * *